(12) United States Patent
Pan

(10) Patent No.: US 11,276,476 B1
(45) Date of Patent: Mar. 15, 2022

(54) COMMON-MODE COMPARISON BASED FUSE-READOUT CIRCUIT

(71) Applicant: Micron Technology, Inc., Boise, ID (US)

(72) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/117,877

(22) Filed: Dec. 10, 2020

(51) Int. Cl.
*G11C 17/00* (2006.01)
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................. G11C 17/18; G11C 17/16
USPC ........................................................... 365/96
See application file for complete search history.

(56) References Cited

U.S. PATENT DOCUMENTS

| 10,304,554 B1 | 5/2019 | Sreeramaneni et al. |
| 2007/0053236 A1* | 3/2007 | Vogelsang ....... G11C 29/50008 365/225.7 |
| 2008/0219072 A1* | 9/2008 | Breen ................. G11C 11/4091 365/205 |

OTHER PUBLICATIONS

U.S. Appl. No. 16/681,413, filed Nov. 12, 2019, Wei Lu Chu.

\* cited by examiner

*Primary Examiner* — Huan Hoang
(74) *Attorney, Agent, or Firm* — Fletcher Yoder, P.C.

(57) ABSTRACT

Systems and methods are provided that sense a state of a fuse located in a fuse array. These methods involve a logic gate that selectively transmits outputs from respective comparators based on the combination of outputs received at the logic gate. The comparators generate outputs based on comparing a signal received indicative of the fuse state and a reference voltage. The described systems and methods reduce power consumption of a fuse sensing device since portions of the fuse sensing device are deactivated when not sensing and enable single fuse reading to occur, among other advantages.

20 Claims, 5 Drawing Sheets

COMMON-MODE COMPARISON BASED FUSE-READOUT CIRCUIT

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Electronic devices, such as semiconductor devices, memory chips, microprocessor chips, image chips, or the like, may include a set of fuses for storing information. For example, the electronic devices, such as semiconductor dies, can include one or more fuse arrays (e.g., a set or a network of fuses or anti-fuses that are programmed to store information). An electronic device may include the one or more fuse arrays in one or more locations to provide support for different circuit components of the electronic device. For instance, a fuse array may provide a voltage shift for a circuit integrated on a semiconductor die or provide information (e.g., redundancy information, wafer lot number, die lot number, die position on the wafer) regarding a respective circuit component on the semiconductor die.

To save space and to make the electronic device more compact, fuse arrays for different circuit components of an electronic device may be positioned in one location in the electronic device, thereby replacing discrete fuses that were located throughout the device in other designs. The semiconductor die can read information (e.g., redundancy information, wafer lot number, die lot number, die position on the wafer) from the fuse array and transmit the information to a respective circuit component disposed at some location within the electronic device.

With this in mind, it should be noted that conditions of the electronic devices can affect the reliability of the fuse reading process. For example, a condition or a setting of the power supplies (e.g., an output thereof), such as during a stabilization period following device startup, initialization, or configuration, can cause an erroneous fuse read. Any such read errors can cause persistent issues throughout the device's operation until the next startup, initialization, or configuration. As such, it is desirable to provide improved systems and methods for ensuring accurate and efficient fuse-reading operations. However, these improved systems and methods may take a relatively long amount of time to read a fuse state, for example, due to an amount of time used to charge a regenerative latch circuit to a switching threshold such that an output associated with the fuse state is able to be read. In this way, it may be desirable to provide systems and methods for improving (e.g., reducing) a duration of time used to perform a fuse-reading operation.

BRIEF DESCRIPTION OF DRAWINGS

Various aspects of this disclosure may be better understood upon reading the following detailed description and upon reference to the drawings in which.

DETAILED DESCRIPTION

Figure 1:
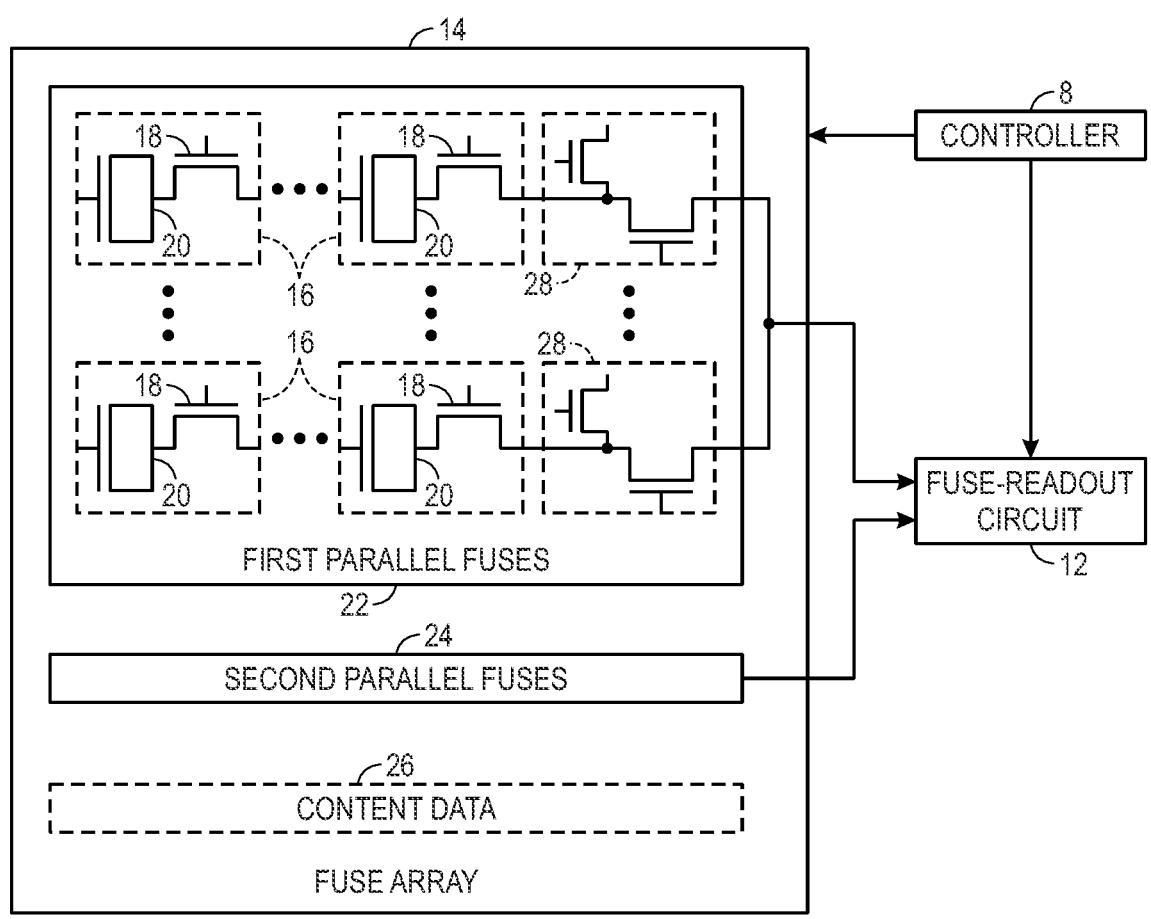
FIG. 1 is a simplified block diagram illustrating an electronic device that includes a fuse-readout circuit for reading states of fuses in different fuse arrays, according to an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Fuse arrays may include a collection of fuses or anti-fuses coupled in parallel with each other, such that the fuses or the anti-fuses may store certain information thereon that may be used by other circuit components of an electronic device (e.g., semiconductor die, chip). To ensure that the data stored on each fuse is read out correctly, an additional fuse may be used to store the same data stored on a respective fuse for redundancy. As such, a fuse-readout circuit may access both fuses associated with a particular dataset to verify that the data read out of one fuse is correct. That is, since both fuses store the same data for redundancy, the fuse-readout circuit should read the same data signal (e.g., voltage, current) from each fuse, thereby confirming that the read data signal is accurate. Although the redundant fuse layout may provide an effective way for determining whether the read data is correct, the readout of both fuses may be affected by various conditions such as poorly blown fuses, nicked fuses, and the like.

To improve the resolution (e.g., amount of current or voltage associated with a fuse) and the speed at which the fuse-readout circuit operates, an electronic device may use a fuse-readout circuit that uses common-mode sensing systems and methods to generate a signal output indicative of a fuse state. The common-mode fuse-readout circuit may use a differential signal acquired from a signal from a first fuse and a reference voltage to compare to another similarly acquired differential signal for a second fuse. By using the two differential signals and additional logic circuitry, the fuse-readout circuit may have different outputs when both differential signals indicate both fuses are unblown versus when one or both fuses are blown. Using common-mode sensing methods in fuse sensing may provide similar benefits as using differential sensing methods but provide the additional benefit of doing so without being based on half of the physical fuses being blown to enable the sensing.

Indeed, common-mode sensing circuits provide relatively high accuracy, reduced sensitivity to parasitic capacitances, reduced sensitivity to pressure, voltage, and/or temperature changes, and reduced sensitivity to device leakage (e.g., current leakage) without having to separately tune each portion of the sensing circuit before sensing, each while also using relatively small amounts of logically blown fuses to perform the sensing. A common-mode fuse-readout circuit uses reference voltages (e.g., stable reference voltages) to evaluate a state of a fuse as opposed to known fuse states. Fuse-readout circuits with logic circuitry to detect when two fuses are unblown may use less blown reference fuses in the reading operation, thereby enabling overall testing times to be reduced since fewer reference fuses are read in the process. Additional details with regard to the functionality of the fuse-readout circuit with the additional logic circuitry are discussed below with reference to FIGS. 1-5.

Turning now to the figures, FIG. 1 is a simplified block diagram of a controller 8 of an electronic device 10 that may employ a fuse-readout circuit 12 (e.g., common-mode fuse-readout circuit, common-mode sensing circuit). The electronic device 10 may sense states of fuses to retrieve identification information, to access data stored in the states of the fuses, to determine whether unsuitable operation occurred that caused a fuse state to change, or the like. Indeed, the electronic device 10 may use information determined from one or more fuse states to perform other operations, such as to authenticate a user to access a portion of software of the electronic device, to verify its own operating characteristics, or the like.

To coordinate sensing operations and any associated pre-charging operations, the controller 8 may transmit signals to and/or receive signals from various components within or outside of the electronic device 10 or the fuse-readout circuit 12. For instance, the controller 8 may include a communication component, one or more processors, a memory, a storage, input/output (I/O) ports, a display, and the like. The communication component may be a wireless or wired communication component that may facilitate communication of signals between the various components of the fuse-readout circuit 12. The one or more processors may be any type of computer processor or microprocessor capable of executing computer-executable code. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal. The I/O ports may be interfaces that couple to other peripheral components such as input devices (e.g., keyboard, mouse, microphone), sensors, input/output (I/O) modules, and the like. The display may operate to depict visualizations associated with software or executable code being processed by the processor.

As noted above, the electronic device 10 may include one or more fuse arrays 14 that each include multiple fuse cells 16 that may store information according to their programming settings (e.g., for blown or unblown fuse setting). In some embodiments, the fuse arrays 14 may be physically located at a specific portion of the electronic device 10 (e.g., at a central or dedicated portion within the die).

The fuse cells 16 may each include a switch 18, a setting circuit 20 (e.g., for anti-fuses or for gate-oxide fuses), or both. The switch 18 may be used to select the particular fuse cell 16 for the reading operation (e.g., based on connecting to a reading circuit). The setting circuit 20 may include configurable circuitry (e.g. an oxide layer) that may represent information. For example, the fuse cells 16 can be anti-fuses or gate oxide fuses that provide a relatively high resistance (e.g., associated with an open circuit) when the setting circuit 20 is not programmed or unblown. When the setting circuit 20 is programmed or blown, the setting circuit 20 itself may be characterized by a relatively low resistance (e.g., as associated with an electrical short), such as through a weakened or damaged oxide layer.

In some embodiments, the fuse array 14 may include parallel fuse sets that can be programmed to provide redundant or backup data and/or for reading the data in parallel. For example, the fuse array 14 may include first parallel fuses 22 and second parallel fuses 24. The first parallel fuses 22 and the second parallel fuses 24 may be programmed with the same or redundant settings/patterns for representing content data 26 (e.g., redundancy information, wafer lot number, die lot number, die position on wafer, voltage adjustment level) that may be used throughout the electronic device 10 (e.g., by circuits other than the fuse array 14).

The electronic device 10 may read the information stored in the first parallel fuses 22 simultaneously with or in parallel to the information stored in the second parallel fuses 24 (e.g., using multiple reading circuits) for accuracy via operations performed by the controller 8. In certain embodiments, the electronic device 10 may store the content data 26 in the fuse array 14 based on the fuse settings (e.g., as a form of persistent or non-volatile storage) for use at one or more designated instances (e.g., at device power-up, at device initialization, at device configuration). At the designated instances, the electronic device 10 may use a switch 28 (e.g., a set of switches) to access (e.g., based on connecting a reading circuit thereto) one or more targeted fuse cells 16. The switch 28 may connect the targeted fuse cell 16 to the fuse-readout circuit 12.

Figure 2:
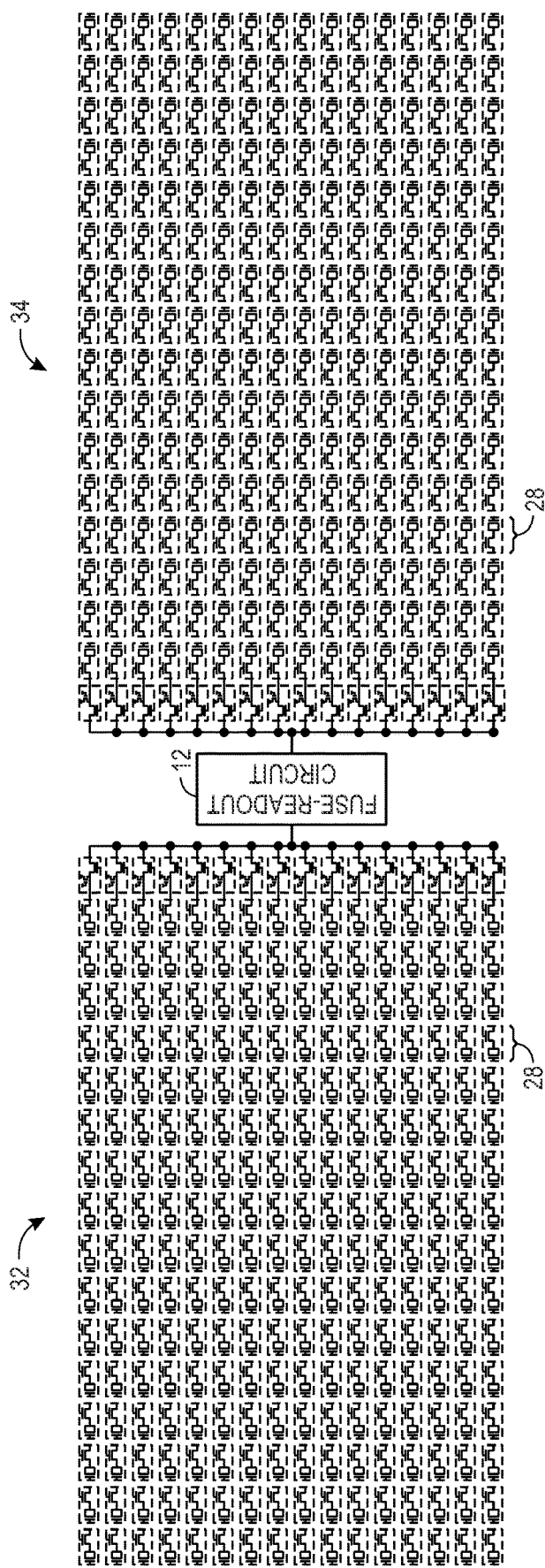
FIG. 2 is a schematic diagram illustrating the fuse-readout circuit and the fuse arrays in the electronic device of FIG. 1, according to an embodiment of the present disclosure.

By way of example, FIG. 2 illustrates two fuse arrays 32 and 34. The first parallel fuses 22 may be part of one fuse array 32 and the second parallel fuses 24 may be part of a separate fuse array 34. The two fuse arrays 32 and 34 may be coupled to the fuse-readout circuit 12. The first fuse array 32 and the second fuse array 34 each include 256 fuse cells 16, and the fuse-readout circuit 12 may be capable of reading the data (e.g., voltage, state of the setting cell 20) from each fuse cell 16. It should be understood that in other cases more or less fuse cells 16 may be included in a fuse array, more or less fuse arrays may be included in a device, and/or more than one fuse-readout circuit 12 may be included in the device. Any suitable combination of components may be used to implement these systems and methods.

To generate an output indicative of the states of setting cells 20, the fuse-readout circuit 12 may receive a positive voltage from both fuse arrays 32 and 34 when both of the connected fuses are blown and no voltage (or relatively less voltage) from the fuse arrays 32 and 34 when the connected fuses are unblown. Indeed, the fuse cells 16 of the fuse array 32 and the fuse cells 16 of the fuse array 34 may be coupled to a common-mode voltage source, such as a positive voltage source (logic high voltage source, VDD). The fuse cells 16 in the fuse arrays 32 and 34 are coupled to a same, or substantially similar, voltage source (e.g., common voltage source, common-mode sensing signal source). In particular, the fuse-readout circuit 12, using common-mode sensing, detects fuse states by comparing a signal from a fuse cell 16 to a reference voltage matching a reference voltage used for another fuse cell (as opposed to a reference voltage having an opposite polarity). Although the following description of the fuse-readout circuit 12 is detailed with regard to the logic high voltage source (VDD) and a logic low voltage source (VSS), the embodiments described herein may also employ a ground source in place of either of these voltage sources. That is, the logic high voltage and the logic low voltage are used to convey different voltage states (e.g., high and low, 1 and 0) and other suitable voltage sources or levels may be used in accordance with the embodiments described herein.

As will be described in greater detail below, by using the fuse-readout circuit 12, the electronic device 10 may receive data signals representing the data stored in a setting circuit 20 at a faster speed. That is, the difference between the signals representative of data stored in the setting circuit 20 from the different fuse arrays 32 and 34 and reference voltages may be used to accurately determine and verify the fuse state (e.g., blown or unblown) of each setting circuit 20 while improving visibility of states, as opposed to individually sensing each setting circuit 20 or differentially sensing setting circuits 20 from the different fuse arrays. Moreover, by using the fuse-readout circuit 12, the electronic device 10 may simultaneously sense a state of setting circuits 20 from two different fuse arrays 32 and 34, thereby eliminating at least one read operation performed when individually reading each setting circuit 20.

Furthermore, the fuse-readout circuit 12 may improve resolution in the sensed data signals, and thus permit reading of high resistance and/or non-linear fuses at high speed with better accuracy (e.g., relatively higher accuracy). Moreover, by relying on differential signaling and time-based margining, the fuse-readout circuit 12 may more reliably read high resistance fuses (e.g., weakly blown fuses) at high speed. As a result, the soak current for blowing setting circuits 20 may decrease, and, consequently, permit scaling down of the footprint of individual setting circuits 20 used in the electronic device 10. The ability of the fuse-readout circuit 12 to operate at higher speeds, as compared to individual readout circuits for different fuse arrays, may enable the number of fuses able to be provided on a die to increase, thereby enabling a higher density die.

Figure 3:
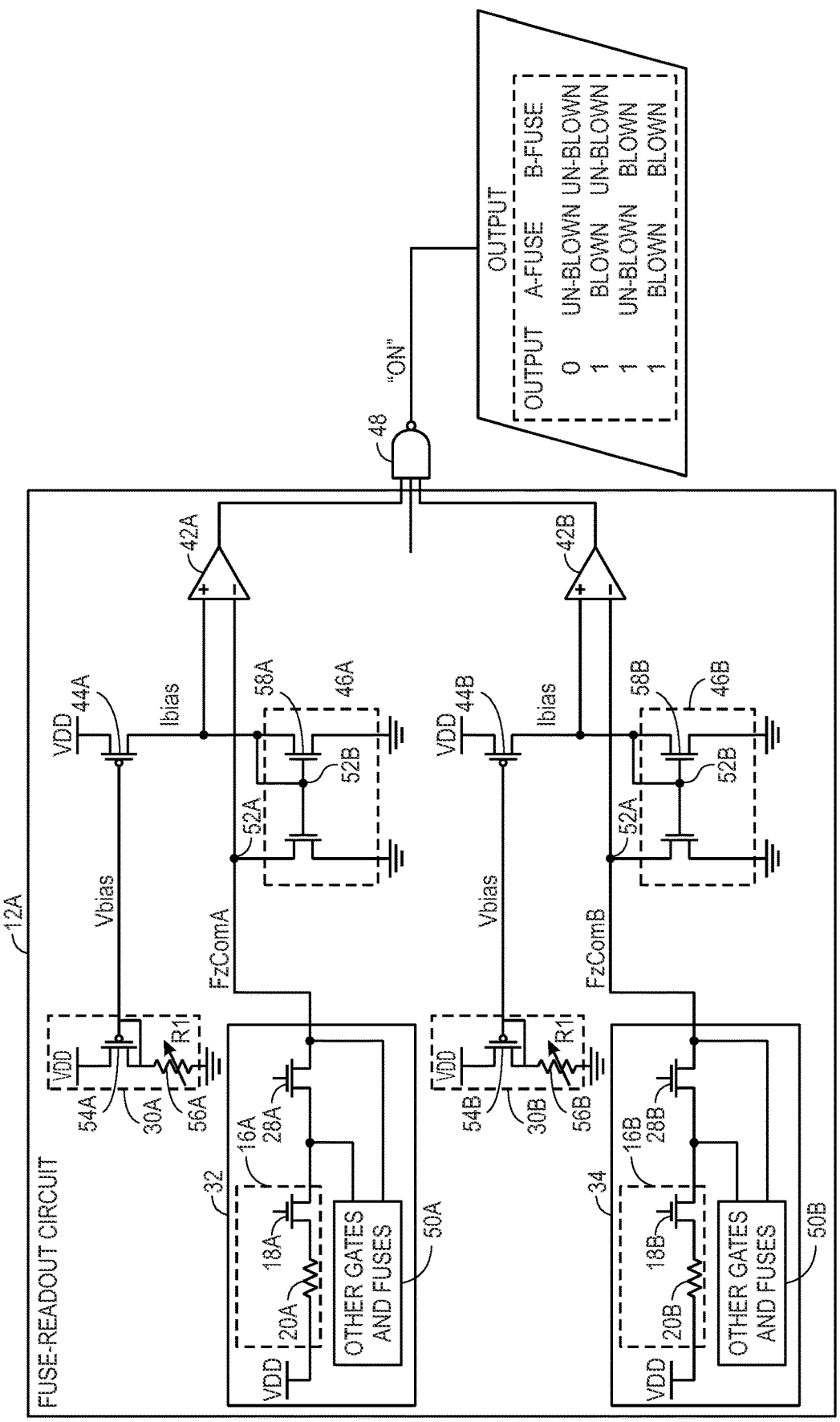
FIG. 3 is a schematic diagram illustrating circuit components that may be part of the fuse-readout circuit in the electronic device of FIG. 1, according to an embodiment of the present disclosure.

With the foregoing in mind, FIG. 3 is a schematic diagram illustrating circuit components of the fuse-readout circuit 12A. As shown in FIG. 3, the fuse-readout circuit 12A may include comparators 42 (42A, 42B), switches 44 (44A, 44B), connecting circuitry to a target fuse in each of the fuse array 32 and the fuse array 34, and other circuitry, like selection circuitries (e.g., switch 18A, switch 18B, switch 28A, switch 28B) and current mirror circuitry 46 (46A, 46B). Outputs from the comparators 42 for each respective fuse array 32 and 34 are transmitted to logic gate 48. When the logic gate 48 is enabled with a control signal (e.g., "ON" signal), an output from the logic gate 48 is able to toggle in response to the respective combination of signals generated based on a state of each setting circuit 20 (20A, 20B) of each fuse cell 16 (16A, 16B). The setting circuit 20 from each fuse array 32 and 34 may be coupled to respective comparators 42 via respective switches 18 and 28. When turned on, the respective switch 18 electrically couples the respective setting circuit 20 to the respective switch 28 and the respective switch 28 electrically couples both to the current mirror circuitry 46.

To sense a state of the setting circuits 20, the controller 8 may transmit control signals (e.g., "ON" signal, enable signal, bias voltage) to the logic gate 48 and the switches 44 to activate the circuitry. By transmitting the control signals, the controller 8 both prepares the logic gate 48 to be sensitive to inputs and activates the current mirror circuitry 46.

Figure 4:
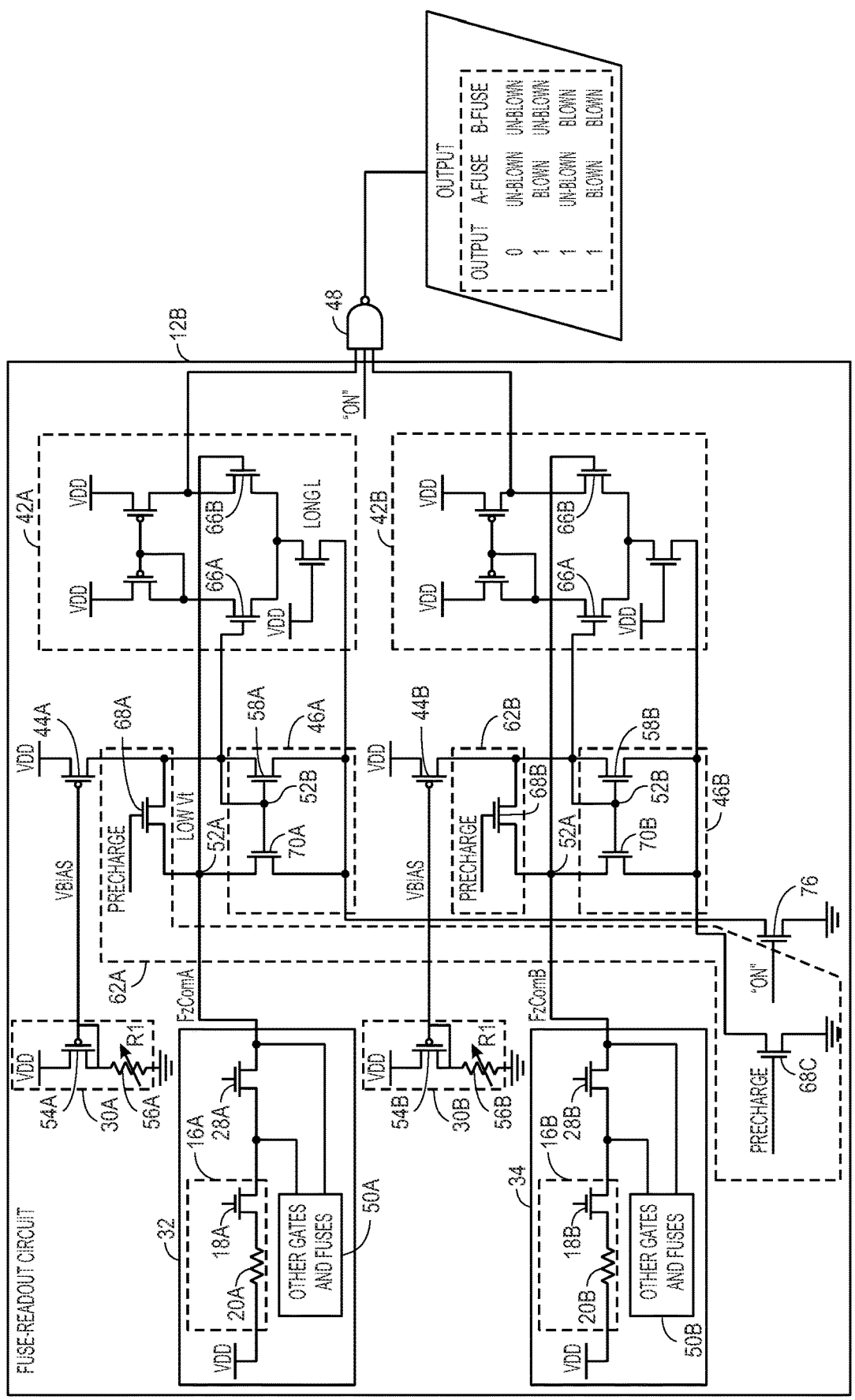
FIG. 4 is a schematic diagram illustrating circuit components that may be part of the fuse-readout circuit of FIG. 3 with additional pre-charge circuitry, according to an embodiment of the present disclosure.

In some cases, the control signals transmitted to each respective switch 44 are not a digital "ON" level. The switches 44 may receive an analog bias voltage level (Vbias) from generation circuitry 30 (30A, 30B). When receiving the bias voltage as a control signal, each switch 44 may not completely turn off, permitting a trickle current to transmit to the rest of the circuitry (e.g., circuits downstream of the switch 44 coupled to the respective drain path). The trickle current may precharge nodes of each comparator 42. There may be multiple suitable ways to generate the Vbias voltage, including the generation circuitry 30 as shown in FIG. 3 and FIG. 4. The generation circuitry 30 may use a programmable resistor 56 that has a resistance value between a blown resistance value of the setting cell 20 and an unblown resistance value of the setting cell 20. Precharging the comparator 42 input with a voltage between voltages corresponding to a blown state and an unblown state of the setting circuit 20 may help reduce a duration of time used for each respective sensing operation since less time is used waiting for voltages to settle at the comparator 42 for the sensing operation.

To elaborate, each generation circuit 30 includes a switch 54 (54A, 54B) and a programmable resistor 56 (56A, 56B). It is noted that the programmable resistors 56A and 56B may have different resistance values, despite both being depicted as "R1" in FIG. 3 and FIG. 4, and thus each programmable resistor 56 may be respectively programmed. When the switches 54 have a substantially similar or equal size as the switches 44, the current (Ibias) transmitted from the switches 44 to the comparator 42A (e.g., to node 52B) has a value defined by a relationship between the system voltage (VDD), the gate-source voltage of the respective switch 44 ($V_{gs}$), and a resistance of the programmable resistor 56 (R1). This relationship is shown in Equation 1. It is noted that each of the switches 44, 54, 58, or the like is shown as either an n-channel MOSFET device (NMOS) or a p-channel MOSFET device (PMOS). It is noted that a different type or quantity of switching devices may be used to provide a trickle current and/or other operations described herein.

$$I_{bias} = \frac{VDD - V_{gs}(PMOS)}{R1} \quad [1]$$

The controller 8 may transmit the control signal to the logic gate 48 at a different time than used to transmit the control signals to the switches 44. While on (e.g., activated), the current mirror circuitry 46 may transmit a current delivered to it from respective fuse arrays 32 and 34 to an input of the respective comparators 42. When transmitting a current, the current transmitted may be adjusted based on the fuse resistance 20 (Rfuse) and a bias current flow (VfzCom) through the node 52A. It is noted that the fuse resistance 20A and the bias current flow, VfzComA, affect the current transmitted to comparator 42A, and that the fuse resistance 20B and the bias current flow, VfzComB, affect the current transmitted to comparator 42B. This adjustment may follow the relationship in Equation 2. By following this relationship, currents supplied to the respective comparators 42 may be less sensitive to capacitance changes made to the setting circuits 20, fuse cells 16, fuse gate arrays 23 and/or 34, or the like. The capacitance changes may include capacitance changes from temperature shifts and/or material degradations.

$$I_{fuse} = \frac{VDD - VfzCom}{Rfuse} \quad [2]$$

When Ifuse equals or is substantially similar in value to Ibias (e.g., Ifuse=Ibias) for one of the fuse cells 16, the two inputs to the respective comparator 42 are the same or substantially similar (e.g., within a threshold amount of current from one another, less than 1.0 milliamp [mA] difference). If it is assumed that the gate-source voltages for switch 44 (Vgs(NMOS)) is equal or substantially similar to the voltage (Vgs(PMOS)) of corresponding of switches 58 (58A, 58B), a resistance of the setting cell 20 (Rfuse) may equal or be substantially similar to the resistance value programmed in programmable resistance 56 (R1) (e.g., Vgs(NMOS)=~Vgs(PMOS)). However, when the resistance of the setting cell 20 (Rfuse) is greater than the resistance value programmed in programmable resistance 56 (R1), the current from the setting cell 20 (Ifuse) is less than the bias current from the switch 44 (Ibias). Thus, the corresponding VfzCom voltage value to the corresponding comparator 42 may be less than a voltage resulting from Ibias transmitting from the corresponding switch 44 (Vgs(NMOS)), causing the comparator 42 to output a logical high voltage value (e.g., "1"). When the resistance of the setting cell 20 (Rfuse) is less than the resistance value programmed in the programmable resistance 56 (R1), the current from the setting cell 20 (Ifuse) may be greater than the bias current from the switch 44 (Ibias). Thus, the corresponding VfzCom voltage value to the corresponding comparator 42 is greater than a voltage resulting from Ibias transmitting from the corresponding switch 44 (Vgs(NMOS)), causing the comparator 42 to output a logical low voltage value (e.g., "0"). As a note, currents from the setting cell 20 (Ifuse) and currents from the switch 44 (Ibias) may be determined using Equation 1 and/or Equation 2. The VfzCom voltage value and the Vgs(NMOS) voltage value may be determined using a relationship shown in Equation 3 and/or Equation 4. It is noted that some values, such as a channel length modulation factor of a MOS transistor ($\lambda$) and a gain factor ($\mu CoxW/2L$) represent material constants associated with specific device constructions of the switches 44, fuse array 32, fuse array 34, or the like, and thus may vary based on specific circuits used.

$$I_{fuse} = \mu CoxW/2L(Vgs(NMOS) - V_t(NMOS))^2(1 + \lambda VfzComA) \quad [3]$$

$$I_{ds} = I_{bias} = \mu CoxW/2L(Vgs(NMOS) - V_t(NMOS))^2(1 + \lambda Vgs(NMOS)) \quad [4]$$

The Ibias currents transmitted via the switches 44 is generated based generally on a current source. A substantially constant voltage, such as the system high voltage (VDD), may be provided to the programmable resistor 56 to form a current source. The programmable resistor 56 resistance value may remain constant for at least a sensing operation, and thus the voltage output from the components to the corresponding of the switches 44 is constant over the sensing operation. It is noted that the programmable resistor 56 may have its resistance changed over time to compensate for changes in resistances of the fuse arrays 32, 34, for example to reduce its resistance in response to material degradation that may happen over time to respective fuses of the fuse arrays 32, 34. Indeed, the programmable resistors 56 may be programmed to a different resistance value based on the respective resistances of its corresponding fuse array. For example, the programmable resistor 56B may be programmed to a lower resistance value than the programmable resistor 56A when fuse array 34 has an average switching resistance value lower than that of the fuse array 32.

To help perform the sensing operation, the current mirror circuitry 46 may receive an output from each setting circuit 20 and may deliver electrical signals having a similar or equal value to each comparator 42. Each current mirror circuit 46A and 46B may respectively interconnect to form a first node 52A and a second node 52B. The nodes 52 permit activation of the current mirror circuitry 46 in response to the corresponding switch 44 transmitting the Ibias. In some cases, sensing may be toggled by selective transmission of the system logical high voltage to the switch 44 and/or the switch 54. By linking the current mirror circuitry 46 operation to the switch 44 operation, the current mirror circuitry 46 receives signals during sensing but may receive fewer signals when not sensing. This may reduce power consumption of the fuse-readout circuit 12A since less power is consumed when sensing is not being performed and/or between sensing operations, which may in turn reduce power consumption of the electronic device 10.

After a suitable amount of time has passed, such as to permit voltages to stabilize (e.g., 1 microsecond (μs), any defined amount of time), or in response to a command or other trigger, the controller 8 may turn on additional switches for sensing, including the switches 18 and the switches 28 corresponding to the target fuse cells 16. In this example, the target fuse cells are fuse cell 16A and fuse cell 16B. It is noted that subsequent or prior sensing operations may be used to sense other setting circuits 20 of the fuse array 32 and/or the fuse array 34. Additional fuse cells 16 and/or devices of the fuse arrays 32 and 34 are represented via other gates and fuses blocks 50 (50A, 50B).

When switches are activated, each fuse array 32 and 34 may output a respective signal to corresponding comparators 42. The signal may be a logic low voltage value (ground, VSS) if the setting circuit 20 is intact and unblown. When transmitting a signal with the logic low voltage value, the signal has a voltage value not matching (e.g., less than, different) that of the reference voltage value (e.g., VDD) provided to the respective comparator 42. Thus, the comparator 42 may output a logic high voltage value based on the difference between the voltages received as inputs (e.g., in accordance with the following equation: VDD–VSS=VDD). However, when the setting circuit 20 is blown and not intact, the signal may be a logic high voltage value (VDD). When transmitting a signal with the logic high voltage value, the signal has a voltage value matching or substantially equal to (e.g., within a threshold voltage of) that of the reference voltage value (e.g., VDD) provided to the respective comparator 42. Thus, the comparator 42 may output a logic low voltage value based on the difference between the voltages received as inputs (e.g., in accordance with the following equation: VDD−VDD=0=VSS).

Each of the comparators 42 may generate an output indicative of a state of the setting circuits 20A and 20B. Indeed, when a respective setting circuit 20 is unblown, the resistance of the unblown setting circuit 20 stops and/or attenuates signals thereby blocking signals from transmitting to the respective switch 18. If one or more signals pass through, the signals are likely of negligible value. A respective comparator 42 may receive one signal from either of the fuse arrays 32 and 34 and one signal from the reference voltages source (VDD) that both have substantially similar voltage values (e.g., equal voltage values). In response to two logic high signals, the comparator 42 outputs a logic low voltage value to the logic gate 48 indicating a detection of no voltage difference. However, when the setting circuit 20 is blown, the comparator 42 may receive two signals having different voltage values, and thus may output a logic high voltage value to the logic gate 48 indicating a detection of the voltage difference. This may similarly apply if a ground voltage was used in place of the logic high voltage value as the reference voltages source. However, in this example, inputs to the comparator may be swapped, so that the negative terminal to the comparator 42 receives the reference voltage and the positive terminal of the comparator 42 receives the output from the corresponding fuse array 32 or 34.

When the logic gate 48 receives the differential sensing resulting signals from the respective comparators 42, if all three inputs to the logic gate 48 are detected by the logic gate 48 as logic low voltage values (e.g., 0-0-0), the logic gate 48 outputs a logic low voltage value signal indicating that both setting circuits 20 are unblown. However, if either output or both outputs from the respective comparators 42 are logic high voltage values (e.g., 0-1-1, 0-1-0, 0-0-1), the logic gate 48 outputs a logic high voltage value signal indicating that one or both setting circuits 20 are blown. This fuse-readout circuit 12A improves differential sensing operations since the fuse-readout circuit 12A may detect a state of the setting circuits 20 without using a blown setting circuit 20 (e.g., blown fuse) as a reference during the sensing.

Since the differential sensing of each comparator 42 is performed relative to a common reference voltage (e.g., VDD), the final result is just negligibly affected by capacitance changes occurring over the duration of the sensing operation. Indeed, using the fuse-readout circuit 12 may reduce a likelihood of a changing parasitic signals and/or capacitances for a node (e.g., node 52A) between the fuse array 32 and the current mirror circuit 46A and/or between the fuse array 34 and the initialization circuit 46B. In some cases, fuse sensing operations may be performed within defined sensing durations (e.g., minimum sensing times) as to reduce occurrence of parasitic signals (i.e., leakage currents) or capacitance changes that may affect the sensing operation.

It is noted that the fuse-readout circuit 12A uses signals from the fuse cells 16 generated based on an electrical connection to a voltage source for the system (e.g., VDD). The generated signals transmitted from the fuse array 32 and/or the fuse array 34 are compared to signals having a substantially similar logic high voltage value (VDD). This arrangement of components enables the resistance of the respective setting circuit 20 to be compared to a resistance of the programmable resistor 56 to determine whether the state of the respective fuse is blown or unblown. The resistance of the unblown setting circuit 20 may be 1 megaohm (MΩ), 2 MΩ, or any suitable resistance greater than the resistance of the switch 44 when turned on (e.g., in an on position, in a closed state, in a transmitting state).

Additionally or alternatively, using these systems to detect a state of a fuse in the fuse arrays 32 and 34 may reduce an overall amount of time spent detecting fuse states. For example, once each component is suitably operated (e.g., turned on, turned off), sensing occurs in a relatively passive manner. In this way, one clocking cycle may be used to turn on or off certain of the switches and the logic gate 48, and another clocking cycle may be used to sense an output from the logic gate 48 to identify the states of the setting circuits 20. But, additional clocking cycles may not be used since intermediary flip-flop circuitry, logic gates, or the like, that trigger in response to a rising or falling edge of a signal may be omitted. This represents a relatively more streamlined sensing operation than previous detection methods.

In some cases, a precharging operation may be performed before sensing the fuse state. This may add a clocking cycle to the sensing operation, for example, to enable voltages to stabilize within interconnecting nodes, at components, and the like, after application of a precharging signal or enabling of precharging circuitry. Precharging systems are discussed further in reference to FIG. 4.

FIG. 4 is a schematic diagram illustrating circuit components of the fuse-readout circuit 12B. As shown in FIG. 4, the fuse-readout circuit 12B includes circuitry discussed above with reference to FIG. 3 and additional pre-charge devices 62 (62A, 62B), thus descriptions related to circuitry of FIG. 3 are relied upon herein. It should be noted that the pre-charge devices 62, switches 44, switches 66 (66A, 66B), switches 68 (68A, 68B, 68C), and/or any depicted transistor may be any suitable switching device such as a transistor, metal-oxide-semiconductor field-effect transistor (MOSFET), or the like. Indeed, the pre-charge devices 62 may also include p-type devices, n-type devices, or both, or any suitable switch, or any suitable combination of switches provided that they are used to perform the operations described herein. Each of the comparators 42 may include the switches 66.

The pre-charge devices 62 include the current mirror circuitry 46 and additional switches 68 (68A, 68B, 68C). When turned on, the switches 68 electrically couple switches 70 (70A, 70B) to switches 44 (44A, 44B) and to the logic low voltage source (ground, VSS). While the switches 44 are on, electrical signals transmit from the logic high voltage source (VDD) to the switches 70, thereby charging respective nodes 52 (e.g., node 52A, node 52B). The fuse-readout circuit 12B also includes a switch 76 that may be turned on at least partially simultaneous to a duration of time that the switches 44 are turned on to couple the comparators 42 to a logic low voltage source, a system ground, or a system reference voltage.

The pre-charge devices 62 are respectively turned on by a "PRE-CHARGE" control signal for a duration of a pre-charge operation. While turned on for the pre-charge operation, the pre-charge devices 62 transmit electrical signals to increase node voltages intercoupling devices of the pre-charge devices 62. The pre-charge devices 62 supply electrical signals to the current mirror circuitry 46 to increase a voltage of the first nodes 52A, the second node 52B, or both. The pre-charge operation may continue until a suitable amount of time passes to increase the voltages of the first nodes 52A and/or the second nodes 52B.

An indication of the suitable amount of time may be stored in memory and accessed by the controller 8. The suitable amount of time may have previously been determined from device testing operations. The controller 8 may manage a counter or time to track a duration passed while performing the pre-charge operation, may use clock rising or falling edges to track a duration of time passed while performing the pre-charge operation, or the like. In some cases, the suitable amount of time may be defined in terms of clock rising or falling edges. The ending of the duration allocated for the pre-charge operation may align with a settling of node voltages of the pre-charge devices 62 at a voltage level greater than of when the pre-charge operation started.

The voltages of the nodes 52 may be substantially equal in value to the logic high voltage source (VDD). Electrical signals generated based on these voltages may transmit to the respective comparators 42 for comparison. The nodes 52 having a similar or equal voltage enables the comparators 42 to perform a common-mode comparison. The voltage value of the logic high voltages source (VDD) may be a value detectable by the logic gate 48 as a logic high value (e.g., logical high, 1).

When transistors or devices used for switches are of opposite types (e.g., n-type MOS versus p-type MOS), such as switches 44 and 68, control signals transmitted to turn on the switches 68 and 44 may have opposite or differing polarities and/or values of voltage. It is noted that certain logic gates and devices are shown as included in the example system and methods. However, it should be understood that alternative or additional combinations of logic gates and/or devices may be used to perform same or similar operations as those described herein.

By employing the fuse-readout circuit 12 described above, semiconductor devices or silicon die that use fuse arrays 32 or 34 to store certain information regarding the device or silicon die may be read more efficiently, as compared to other methods of sensing fuse states. That is, pre-charging the fuse-readout circuit 12B may improve an ability of the fuse-readout circuit 12 to accurately detect blown fuses (e.g., fuse cell 16), unblown fuses, the states of nicked or damaged fuses, and the like. In addition, the common-mode fuse reads performed by the fuse-readout circuit 12 may enable the circuit to accurately detect that one fuse has been blown even when the other fuse has not been blown though it should have been blown. That is, the inability of one fuse to blow does not prevent the ability of the fuse-readout circuit 12 to provide data to other devices to indicate that one of the fuses is blown.

Figure 5:
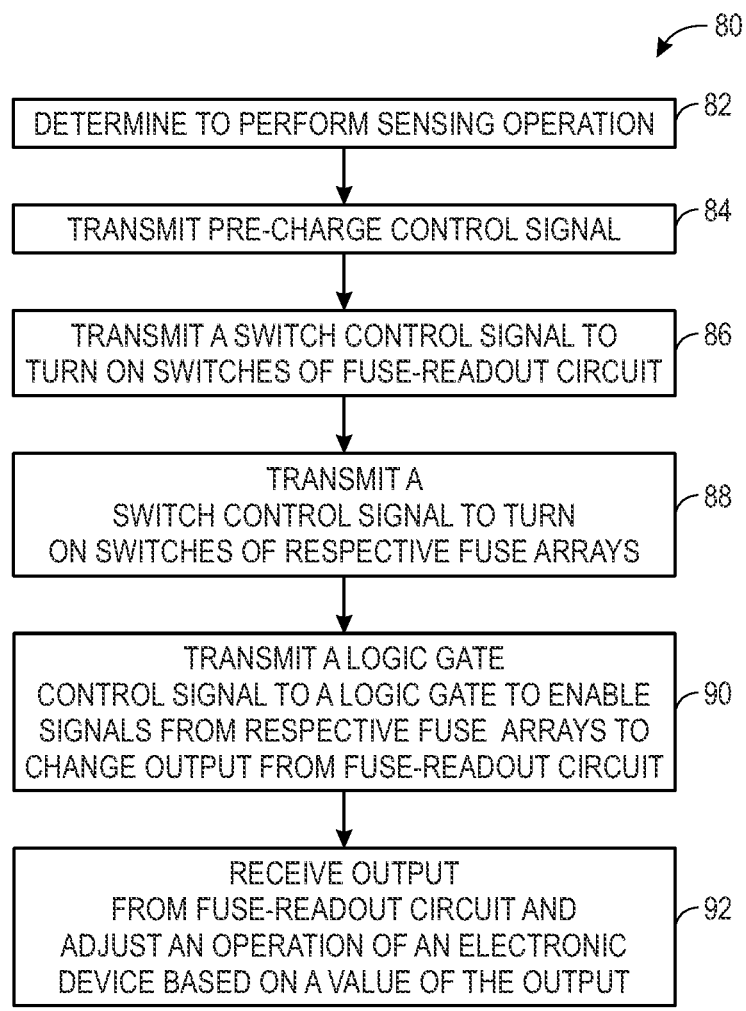
FIG. 5 is a flowchart of a process for performing a sensing operation to identify a fuse state and using results from the sensing operation in another computing operation, according to an embodiment of the present disclosure.

To further elaborate on sensing, FIG. 5 is a flowchart of a process 80 for performing a sensing operation to identify a fuse state and using results from the sensing operation in another computing operation. The controller 8 is described below as performing the process 80 via operations performed using the fuse-readout circuit 12, but it should be understood that any suitable processing circuitry may additionally or alternatively perform the process 80, including additional control circuitry, a dedicated memory controller, one or more processors, or the like. Furthermore, although the process 80 is described below as being performed in a particular order, it should be understood that any suitable order may be used to perform individual operations of the process 80.

At block 82, the controller 8 may determine to perform a sensing operation to detect states of two setting circuits 20 corresponding to fuse arrays 32 and 34. The controller 8 may determine to perform the sensing operation in response to a command from software or another hardware of the electronic deice 10, in response to an interrupt signal being generated, or the like. To perform the sensing operation using the fuse-readout circuit 12B, the controller 8 may transmit a pre-charge control signal, at block 84. It is noted that when the controller 8 uses the fuse-readout circuit 12A to sense fuse states as opposed to using the fuse-readout circuit 12B, block 84 may be skipped. In cases where the controller 8 uses both the fuse-readout circuit 12A and the fuse-readout circuit 12B, the controller 8 may perform the operations of block 84 but the operations may affect the fuse-readout circuit 12B without affecting the fuse-readout circuit 12A.

At block 84, the controller 8 may turn on switches 68 for a defined duration of time to pre-charge nodes of the fuse-readout circuit 12B. There may be some cases where the controller 8 transmits a control signal to the switch 68A for a different amount of time than to the switch 68B. For example, transmitting the control signals for different durations of time may hold the switches 68 closed for different durations of time, thereby changing how long each respective set of nodes has to pre-charge prior to performing the sensing. This may permit subsets of the nodes of the fuse-readout circuit 12 to be charged longer than other nodes. By changing the duration of the charging, the controller 8 may compensate for material and/or performance differences between portions of circuitry of the fuse-readout circuit 12 and/or of the fuse arrays 32 and 34.

At block 86, the controller 8 may transmit a switch control signal to turn on or turn off one or more switches of the fuse-readout circuit 12. More than one switch control signal may be transmitted. Switches controlled at block 86 may include any suitable switch. For example, switches 76, 44A, and 44B may be turned on using a control signal and/or bias voltage at least partially at a same time that switches 68A, 68B, and 68C are turned off (e.g., turned off at the completion of pre-charging operations).

Operations of block 86 may be performed at least partially simultaneous to operations of block 88 and 90. At block 88, the controller 8 may transmit another switch control signal to turn on or off one or more switches of the respective fuse arrays 32 and 34. For example, one or more control signals turning on switches 18A and 28A may be used to activate circuitry of fuse array 32 for sensing of the setting circuit 20A. Circuitry of the other gates and fuses 50A may remain electrically disconnected as to not affect the sensing operation. Staggering activations of portions of the fuse-readout circuit 12 may help not overlap sensing with settling times if overlapping is undesired.

At block 90, the controller 8 may transmit a logic gate control signal to the logic gate 48 to enable signals from respective fuse arrays 32 and 34 to change output from the fuse-readout circuit 12A and/or fuse-readout circuit 12B. The controller 8 may wait to transmit the logic gate control signal until a duration of time passes suitable for voltages to settle. In some cases, the controller 8 may transmit a control signal to the logic gate 48 at a same or substantially similar time as transmission of the control signals at block 86 and/or block 88. In these cases, the output from the logic gate 48 may change as voltages of nodes within the fuse-readout circuit 12A and/or fuse-readout circuit 12B settle, and thus the controller 8 may wait a duration of time until the output values settles before taking a final measurement for the sensing operation.

At block 92, the controller 8 may receive the output from the fuse-readout circuit 12A and/or fuse-readout circuit 12B and may adjust an operation of the electronic device 10 based on a value of the output and/or historical performances of the fuse arrays 32 and/or 34. For example, when a threshold number of states of the fuses is detected, the controller 8 may compare success or fail rates to what was expected as a result of the detection. The controller 8 may have access (e.g., stored in memory, otherwise accessible to controller 8) to an expected distribution of fuse states and may use the expected distribution of fuse states to determine when detection quality has decreased relative to a previous detection quality (e.g., at an earlier time). The expected distribution of fuse states may include expected indications of a quantity of operational fuses (e.g., how many are working), a quantity of non- or sub-operational fuses (e.g., how many have undesirable operation), a quantity of disabled fuses (e.g., how many are intentionally disabled or desired as set to the disabled or non-operational, blown state), a quantity of fuses indicating a logical high state (e.g., blown), or a quantity of fuses indicating a logical low state (e.g., unblown), for example. Other analysis may be performed by the controller 8. In this way, the controller 8 may receive the sensed signal (e.g., output from logic gate 48), associate a value of the signal with a current performance, determine that the current performance deviates from an expected performance, and determine an adjustment to apply to the operation based on the deviation of the current performance from the expected performance.

One or more operations of the electronic device 10 may be changed as a result or based on the controller 8 analysis of fuse states. For example, when the controller 8 deems that operation and/or fuse state distribution is as desired (e.g., a distribution is within a threshold amount of distribution deviation from a target distribution), the controller 8 may continue operation of the electronic device 10 as normal. Thus, the controller 8 may continue to detect states of the fuses of the fuse arrays 32 and 34.

However, when the controller 8 deems that operation is undesired and/or that the fuse state distribution is unsuitable, the controller 8 may generate an alert to notify an operator or trigger a portion or operation of the electronic device 10 to remedy the undesired operation and/or unsuitable fuse state distribution. In some cases, this may involve an adjustment of the value of the voltage source used for sensing, an adjustment of an impedance or resistance of a portion of the fuse-readout circuit 12A and/or fuse-readout circuit 12B (e.g., to cancel out parasitic capacitances affecting sensing operation), or the like. The controller 8 may additionally or alternatively respond in a manner defined and stored in memory (e.g., in a look-up table) based on the particular deviation or undesired operation. For example, the controller 8 may reference a look-up table, or a value otherwise stored and accessible, to determine an adjustment to make to operation of the electronic device 10 based on the difference, such as a difference between expected and actual success/fail rates of the fuses state detection operations.

As noted above, the fuse-readout circuit 12A and/or fuse-readout circuit 12B include the logic gate 48. When one (or both) fuses are blown, the output of the logic gate 48 is low. This output may be used to obtain a high fuse blow success rate. For example, if a single fuse blown success rate is 90%, the inclusion of the logic gate 48 (e.g., use of the OR function) may increase the success rate to 99%. During testing, switches 28 may be used to determine whether setting circuit 20A or 20B were blown successfully (i.e., suitably). In a normal read operation, both switches 28 are turned on. However, during a single fuse read and/or single fuse read testing, one of the switches 28 is turned on and the other is turned off, such as when the setting circuit 20A or setting circuit 20B is to be tested. Operating the circuit in this manner forces one of outputs to an "unblown" state of the setting circuit 20, enabling the other output to control the state of the single output by the logic gate 48. Thus, fuse state information may be obtained separately for any fuse of the fuse arrays 32 and 34, thereby improving fuse readout operations by increasing a flexibility of sensing.

In some cases, outputs from comparators 42 may transmit to respective gate-keeper logic gates that selectively permit transmission of the outputs to the controller 8 based on an enable or on signal. This is similar to operations of the logic gate 48 since the logic gate 48 is used to toggle the ability of the fuse-readout circuit 12 to actually output a signal indicative of the sensing operation. In this example, there may be respective of the logic gates 48 coupled to outputs from the comparators 42 to permit similar toggling of separate outputs for each fuse array to be output to the controller 8. This arrangement (e.g., where outputs from the comparators 42 have respective of the logic gates 48) may provide the controller 8 with two signal outputs that respectively identify the logic state of the setting circuits 20.

Technical effects of the present disclosure include reduced detection durations used to sense a state of a fuse. To do so, the described systems and methods provide a fuse-readout circuit that compares a resistance and current of a first fuse to a target resistance and current (i.e., through voltage comparisons or other suitable method) using a current mirror and a comparator to determine a state of the first fuse. The fuse-readout circuit does the same to a second fuse (e.g., in a different fuse array, a different location of the electronic device, the same fuse array, or other suitable location) to determine a state of the second fuse. To finalize an output from the fuse-readout circuit, the fuse-readout circuit compares the state of the second fuse to the state of the first fuse to generate a final output. These systems and methods thus provide a way to detect when the two fuses are both unblown, an improvement to previous methods.

There may be other advantages to using these system and methods. For example, time used to perform these sensing operations (i.e., detection operation) may be reduced when using a pre-charging operation to pre-charge voltages supplied to the fuse-readout circuitry. Pre-charging the fuse-readout circuitry, such that one or more nodes of the fuse-readout circuitry is at a voltage closer in magnitude to a switching voltage of a logic gate and/or comparator, may reduce a time used to change an output of the fuse-readout circuit since less time is used to get the logic gate and/or the comparator to the switching voltage. Additional or alternative benefits may include how sensing systems and methods as described above may use fewer blown fuses to perform the sensing operations. Read accuracy of these sensing systems and methods may be an improvement other systems and methods since a resistance of the fuse read voltage is in the same direction as logic for the fuse state read operation. The benefits may also include improved sensitivities to device leakage signals (e.g., signal leakage) since unselected fuses (e.g., transistors associated with unselected fuses) have negative gate-source and drain-source voltages, which may offset and/or compensate for the device leakage signals.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A fuse-readout circuit, comprising:
a current mirror configured to receive an output from a portion of a fuse gate array comprising a fuse to be sensed, wherein the current mirror comprises connections forming a first node and a second node;
a comparator coupled to the current mirror, wherein the comparator comprises a first input coupled to the first node and a second input coupled to the second node, and wherein the comparator is configured to generate an output indicative of a state of the fuse when the portion of the fuse gate array is selected; and
a logic gate configured to receive an enable signal, wherein the enable signal permits the logic gate to transmit an additional output in response to the output.

2. The fuse-readout circuit of claim 1, wherein the comparator is configured to generate the output indicative of the state of the fuse when the portion of the fuse gate array is selected and when a reference voltage is permitted to transmit to the comparator.

3. The fuse-readout circuit of claim 1, comprising an additional current mirror and an additional comparator, wherein the additional current mirror and the additional comparator both generate an output indicative of a state of an additional fuse, and wherein the additional output of the logic gate is also based on the output indicative of the state of the additional fuse from the additional comparator.

4. The fuse-readout circuit of claim 1, comprising a pre-charge device, wherein the pre-charge device supplies electrical signals to the current mirror to increase a voltage of the first node, the second node, or both.

5. The fuse-readout circuit of claim 4, wherein the pre-charge device is turned on before the portion of the fuse gate array is turned on for sensing.

6. The fuse-readout circuit of claim 5, wherein the pre-charge device is turned off before the portion of the fuse gate array is turned on for sensing.

7. The fuse-readout circuit of claim 4, wherein the pre-charge device is turned on for a different duration of time than an additional pre-charge device associated with a same sensing operation.

8. The fuse-readout circuit of claim 1, comprising an additional current mirror that generates an additional output based on a state of an additional fuse.

9. A semiconductor device, comprising:
a fuse-readout circuit comprising a first current mirror coupled to a first comparator and a second current mirror coupled to a second comparator, wherein the first comparator and the second comparator both output signals to respective inputs of a logic device; and
a controller configured to:
operate the first current mirror to receive a first current associated with a first fuse and operate the second current mirror to receive a second current associated with a second fuse, wherein the first current mirror outputs the first current to the first comparator, and wherein the second current mirror outputs the second current to the second comparator;
enable the logic device to transmit a signal indicative of a first output from the first comparator and a second output from the second comparator; and
adjust an operation of a circuit based at least in part on the signal transmitted from the logic device.

10. The semiconductor device of claim 9, wherein the controller is configured to:
receive the signal;
associate a value of the signal with a current performance;
determine that the current performance deviates from an expected performance; and
determine an adjustment to apply to the operation based on the deviation of the current performance from the expected performance.

11. The semiconductor device of claim 9, wherein the controller is configured to:
operate a first pre-charge device and a second pre-charge device to pre-charge the first current mirror and the second current mirror; and
operate the first current mirror to receive the first current and operate the second current mirror to receive the second current after pre-charging the first current mirror and the second current mirror.

12. The semiconductor device of claim 11, wherein the first pre-charge device and the second pre-charge device each comprise a p-type transistor, and wherein the first pre-charge device and the second pre-charge device are operated to pre-charge the first current mirror and the second current mirror at least in part by electrically coupling a third pre-charge device to ground while the third pre-charge device is electrically coupled to the first pre-charge device and the second pre-charge device.

13. The semiconductor device of claim 11, wherein the controller is configured to operate the first pre-charge device and the second pre-charge device, at least in part, by sending a pre-charge signal to pre-charge a node.

14. The semiconductor device of claim 13, wherein the logic device comprises a not-AND logic gate that is configured to output the signal comprising a logic low voltage level when both the first fuse and the second fuse are un-blown.

15. A method, comprising:
operating a first current mirror to receive a first current characterized by a value indicating a state of a first fuse, wherein the first current mirror outputs the first current to a first comparator;
operating a second current mirror to receive a second current characterized by a value indicating a state of a second fuse, wherein the second current mirror outputs the second current to a second comparator;
operating a logic device to transmit a signal indicative of a first output from the first comparator and a second output from the second comparator; and
receiving the signal from the logic device and storing an indication of a value of the signal.

16. The method of claim 15, comprising:
pre-charging the first current mirror for a first duration of time; and
pre-charging the second current mirror for a second duration of time different from the first duration of time but partially overlapping to the first duration of time.

17. The method of claim 15, wherein the operation of the first current mirror to receive the first current occurs after pre-charging of the first current mirror.

18. The method of claim 15, comprising:

receiving the signal;

associating the value of the signal with a current performance;

determining that the current performance deviates from an expected performance; and determining an adjustment to apply to an operation of another circuit based on the deviation of the current performance from the expected performance.

19. The method of claim 15, comprising:

receiving a command generated by software of a semiconductor device;

determining to perform a sensing operation in response to the command; and in response to determining to perform the sensing operation, activating control signals to operate to the first current mirror to receive the first current and to operate the second current mirror to receive the second current.

20. The method of claim 19, comprising:

operating a first fuse array to generate the first current at least partially simultaneous to operating the first current mirror to receive the first current; and operating the first fuse array to stop generation of the first current after a duration of time passes suitable for the first current mirror to deliver the first current to the first comparator.

* * * * *